(12) United States Patent
Huang et al.

(10) Patent No.: US 11,482,470 B2
(45) Date of Patent: Oct. 25, 2022

(54) ELECTRONIC PACKAGE AND FABRICATION METHOD THEREOF

(71) Applicant: SILICONWARE PRECISION INDUSTRIES CO., LTD., Taichung (TW)

(72) Inventors: Yu-Lung Huang, Taichung (TW); Chee-Key Chung, Taichung (TW); Chang-Fu Lin, Taichung (TW); Yuan-Hung Hsu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/872,740

(22) Filed: May 12, 2020

(65) Prior Publication Data

US 2021/0287962 A1  Sep. 16, 2021

(30) Foreign Application Priority Data

Mar. 12, 2020 (TW) .................. 109108195

(51) Int. Cl.
*H01L 23/433* (2006.01)
*H01L 21/48* (2006.01)
*H01L 23/00* (2006.01)

(52) U.S. Cl.
CPC ........ *H01L 23/433* (2013.01); *H01L 21/4871* (2013.01); *H01L 24/29* (2013.01); *H01L 24/32* (2013.01); *H01L 24/83* (2013.01); *H01L 2224/29194* (2013.01); *H01L 2224/32245* (2013.01)

(58) Field of Classification Search
CPC . H01L 2224/29194; H01L 2224/32245; H01L 21/4871
See application file for complete search history.

(56) References Cited

U.S. PATENT DOCUMENTS

2001/0001989 A1* 5/2001 Smith ............... H01L 23/49816
174/565

* cited by examiner

*Primary Examiner* — Dale E Page
*Assistant Examiner* — Wilner Jean Baptiste
(74) *Attorney, Agent, or Firm* — Kelly & Kelley, LLP

(57) ABSTRACT

An electronic package is provided and includes an electronic element, an intermediary structure disposed on the electronic element, and a heat dissipation element bonded to the electronic element through the intermediary structure. The intermediary structure has a flow guide portion and a permanent fluid combined with the flow guide portion so as to be in contact with the electronic element, thereby achieving a preferred heat dissipation effect and preventing excessive warping of the electronic element or the heat dissipation element due to stress concentration.

16 Claims, 7 Drawing Sheets

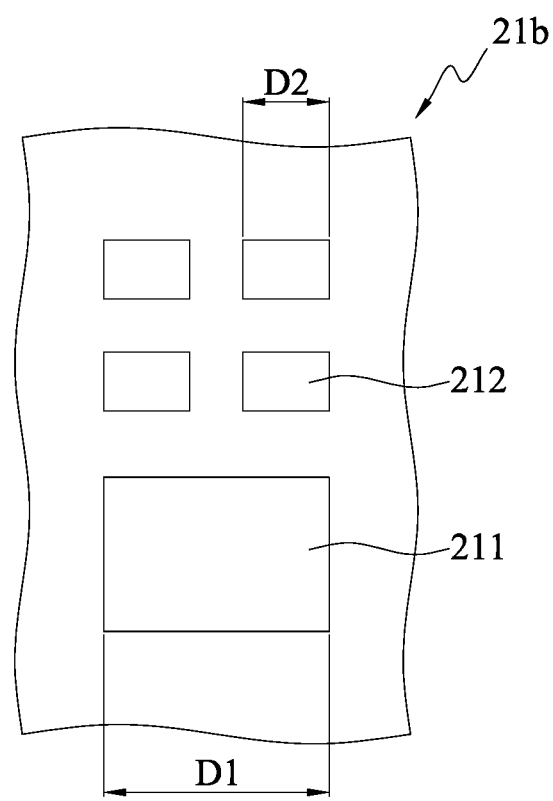
FIG. 2B'
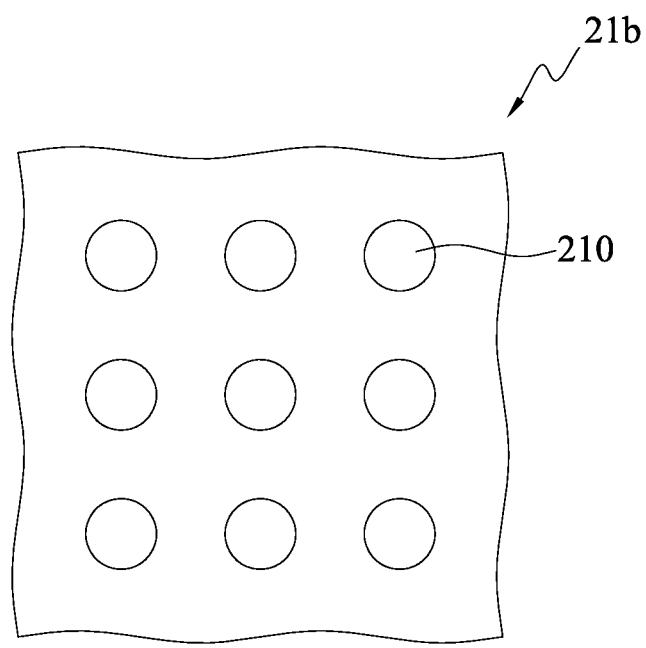
FIG. 2B"

ELECTRONIC PACKAGE AND FABRICATION METHOD THEREOF

CROSS-REFERENCE TO RELATED APPLICATIONS

This application claims priority to Taiwan Application Serial No. 109108195, filed on Mar. 12, 2020. The entirety of the above-mentioned patent application is hereby incorporated by reference herein and made a part of this specification.

BACKGROUND

1. Technical Field

The present disclosure relates to packaging structures, and more particularly, to an electronic package having a heat dissipation element and a fabrication method thereof.

2. Description of Related Art

Along with the increasing demands of electronic products for functions and processing speed, semiconductor chips that serve as core components of the electronic products are required to have higher density of electronic elements and electronic circuits, and consequently, the semiconductor chips generate more heat during operation. Further, since the semiconductor chips are conventionally encapsulated by an encapsulant having a thermal conductivity of only 0.8 W/mk, i.e., the semiconductor chips have a poor heat dissipation efficiency, if heat generated by the semiconductor chips cannot be effectively dissipated, problems such as damage of the semiconductor chips and reduced product reliability may occur.

Therefore, in order to dissipate heat to the outside rapidly, a heat sink or heat spreader is generally provided in a semiconductor package. The heat sink is usually bonded to a back surface of a semiconductor chip through a thermal adhesive so as to dissipate heat generated by the semiconductor chip through the thermal adhesive and the heat sink. Further, a top surface of the heat sink is usually exposed from the encapsulant or directly exposed to the atmosphere to thereby achieve a preferred heat dissipation effect.

FIG. 1 is a schematic cross-sectional view of a conventional semiconductor package 1. Referring to FIG. 1, an active surface 11a of a semiconductor chip 11 is flip-chip bonded onto a packaging substrate 10 through conductive bumps 110 and an underfill 111. Then, a top portion 130 of a heat dissipation element 13 is bonded onto an inactive surface 11b of the semiconductor chip 11 through a thermal adhesive 12, and support legs 131 of the heat dissipation element 13 are disposed on the packaging substrate 10 through an adhesive layer 14. Then, a molding process is performed to form an encapsulant (not shown) that encapsulates the semiconductor chip 11 and the heat dissipation element 13 while exposing the top portion 130 of the heat dissipation element 13 from the encapsulant.

In operation, heat generated by the semiconductor chip 11 is conducted through the inactive surface 11b and the thermal adhesive 12 to the top portion 130 of the heat dissipation element 13 so as to be dissipated to the outside of the semiconductor package 1.

However, in the conventional semiconductor package 1, the thermal adhesive 12 has a poor heat conduction capability after being cured, thus leading to a limited heat dissipation effect. As such, the semiconductor package 1 cannot meet the high heat dissipation requirement.

Further, when the thickness of the semiconductor package 1 is reduced and the area thereof is increased, deformation (i.e., the degree of warping) is significant due to a mismatch between the coefficients of thermal expansion (CTEs) of the heat dissipation element 13 and the thermal adhesive 12. If the deformation becomes too large, delamination is prone to occur between the top portion 130 of the heat dissipation element 13 and the thermal adhesive 12 (or the semiconductor chip 11), thus reducing the heat conduction effect, impairing the appearance of the semiconductor package 1 and even adversely affecting the product reliability.

Furthermore, during the fabrication process of the semiconductor package 1, after the adhesive layer 14 is added onto the packaging substrate 10 by heating, the support legs 131 of the heat dissipation element 13 are directly attached to the adhesive layer 14. As such, after the adhesive layer 14 is cooled, an adhesive force is generated to bond the packaging substrate 10 and the heat dissipation element 13 together. However, air bubbles may be generated during heating of the adhesive layer 14, thus reducing the structural strength of the adhesive layer 14 and easily causing delamination of the heat dissipation element 13.

Therefore, how to overcome the above-described drawbacks of the prior art has become an urgent issue in the art.

SUMMARY

In view of the above-described drawbacks, the present disclosure provides an electronic package, which comprises: an electronic element; an intermediary structure disposed on the electronic element, wherein the intermediary structure comprises a flow guide portion and a permanent fluid combined with the flow guide portion, and wherein the permanent fluid is attached onto the electronic element; and a heat dissipation element bonded to the electronic element through the intermediary structure.

The present disclosure further provides a method for fabricating an electronic package, which comprises: forming an intermediary structure on a heat dissipation element, wherein the intermediary structure comprises a flow guide portion and a permanent fluid combined with the flow guide portion; and laminating an electronic element on the intermediary structure to bond the electronic element with the heat dissipation element through the permanent fluid.

In the above-described electronic package and fabrication method thereof, the permanent fluid is liquid metal or oil.

In the above-described electronic package and fabrication method thereof, the flow guide portion is a plate, and the formation of the intermediary structure further comprises: leveling the permanent fluid on the heat dissipation element; and arranging the plate on the permanent fluid correspondingly. For example, the plate is a metal plate. In another embodiment, the plate has a plurality of meshes with different specifications. In a further embodiment, the plate has a plurality of first meshes and a plurality of second meshes, and the first meshes are greater in width than the second meshes.

In the above-described electronic package and fabrication method thereof, the heat dissipation element comprises a heat dissipation body and support legs disposed on the heat dissipation body, and the heat dissipation body is bonded to the electronic element through the intermediary structure. For example, the heat dissipation body has a concave-convex structure. Alternatively, the support legs have concave-convex structures.

In the above-described electronic package and fabrication method thereof, the heat dissipation element has a concave-convex structure.

In the above-described electronic package and fabrication method thereof, the heat dissipation element has an air space for retaining overflow of the permanent fluid.

The above-described electronic package and fabrication method thereof further comprise a stop portion disposed on the heat dissipation element for stopping overflow of the permanent fluid. For example, the stop portion is bonded onto the heat dissipation element through a bonding layer. Alternatively, the stop portion and the heat dissipation element are integrally formed.

The above-described electronic package and fabrication method thereof further comprise a carrier for carrying the electronic element, wherein the carrier is electrically connected to the electronic element. The above-described electronic package and fabrication method thereof further comprise a stop portion disposed on the heat dissipation element, and a gap or a strengthening layer formed between the stop portion and the carrier. Alternatively, a gap or a strengthening layer is formed between the heat dissipation element and the carrier.

In the above-described electronic package and fabrication method thereof, the intermediary structure further comprises an auxiliary portion bonded to the electronic element and/or the heat dissipation element to come into contact with the permanent fluid.

Therefore, since the intermediary structure is made of flexible materials, the present disclosure can effectively disperse thermal stresses. Further, the flow guide portion has extremely high thermal conductivity and specific heat capacity so as to improve the overall heat transfer efficiency of the intermediary structure. Furthermore, due to a high surface tension of the permanent fluid, the flow guide portion can restrain the flow of the permanent fluid on the surface of the electronic element. Compared with the prior art, the intermediary structure of the electronic package of the present disclosure not only achieves a better heat dissipation effect, but also can prevent excessive warping of the electronic element or the heat dissipation element due to stress concentration.

Further, the arrangement of the stop portion facilitates to lengthen the flow path of the permanent fluid. Consequently, it is not easy for the permanent fluid to flow out of the heat dissipation element.

Furthermore, when the temperature rises, the volume of the permanent fluid expands and thus the permanent fluid flows into the air space, thereby preventing the permanent fluid from adversely affecting the operation of the electronic element or the heat dissipation element.

In addition, the concave-convex structures of the support legs strengthen the bonding. Therefore, compared with the prior art, the engagement between the concave-convex structures and an adhesive layer can prevent delamination of the heat dissipation element during a heating process.

BRIEF DESCRIPTION OF THE DRAWINGS

FIG. 2A' is a partial schematic cross-sectional view illustrating another embodiment of FIG. 2A;

FIGS. 2B' and 2B" are partial schematic upper views of FIG. 2B;

FIG. 2D' is a partial schematic upper view of FIG. 2D;

FIG. 3' is another aspect of FIG. 3; and

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first," "second," "on," "a," etc., are merely for illustrative purposes and should not be construed to limit the scope of the present disclosure.

FIGS. 2A to 2D are schematic cross-sectional views illustrating a method for fabricating an electronic package 2 according to the present disclosure.

Figure 1:
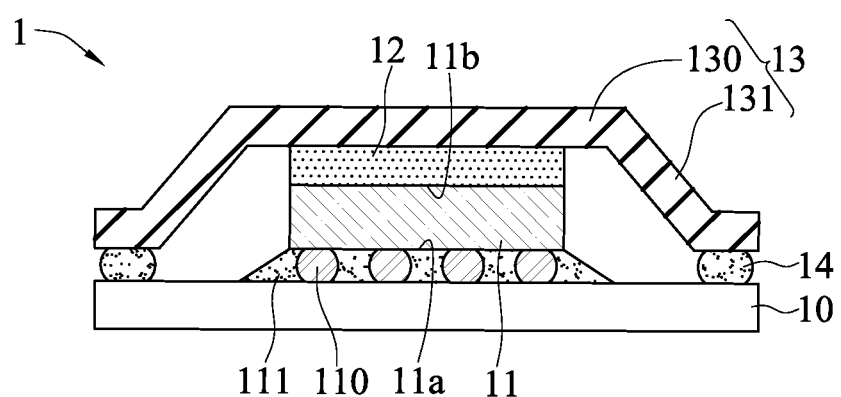
FIG. 1 is a schematic cross-sectional view of a conventional semiconductor package.
Figure 2A:
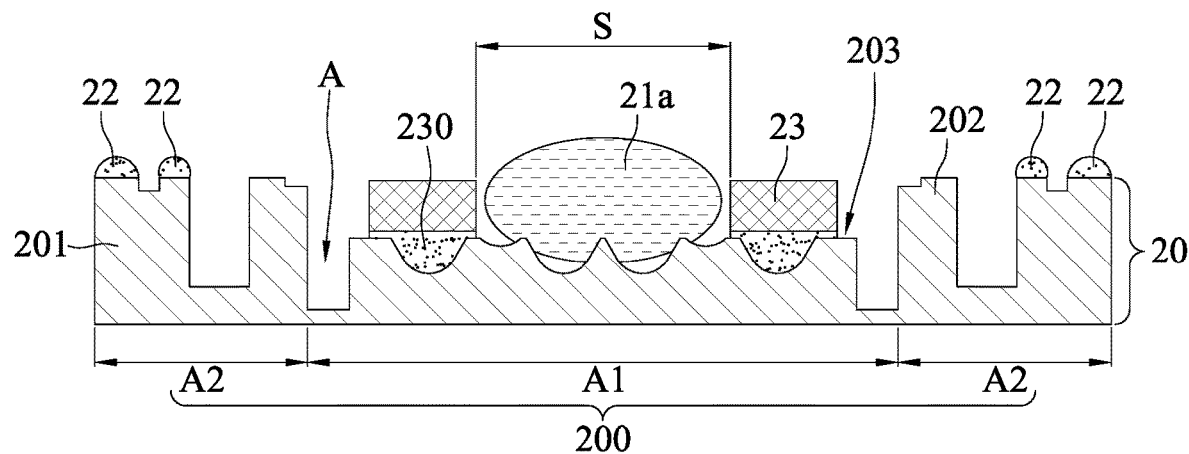
FIGS. 2A to 2D are schematic cross-sectional views illustrating a method for fabricating an electronic package according to the present disclosure.
Figure 2A:
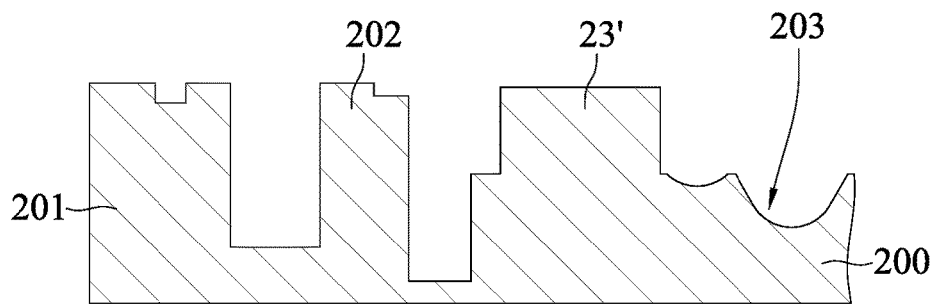

As shown in FIG. 2A, a heat dissipation element 20 is provided, which comprises a heat dissipation body 200 and a plurality of first support legs 201 and a plurality of second support legs 202 disposed on the heat dissipation body 200. Therein, a concave-convex structure 203 is integrally formed on a partial surface of the heat dissipation body 200. Then, a permanent fluid 21a is formed on the heat dissipation body 200, and a bonding material 22 is formed on the first support legs 201.

In an embodiment, the heat dissipation element 20 is a metal member, and the heat dissipation body 200 is in the form of a sheet having a first section A1 and a second section A2 adjacent to the first section A1. The first section A1 is arranged with the concave-convex structure 203, and the second section A2 is arranged with the first support legs 201 and the second support legs 202.

Further, a stop portion 23 is arranged on the first section A1 of the heat dissipation body 200 to stop overflow of the permanent fluid 21a. For example, the stop portion 23 is mounted on the concave-convex structure 203. The stop portion 23 is a ring body such as an O-ring, which is bonded to an edge of the first section A1 through a bonding layer 230 such as an adhesive, so as to define a receiving space S in the first section A1 for receiving the permanent fluid 21a. Alternatively, as shown in FIG. 2A', the stop portion 23' and the heat dissipation body 200 (heat dissipation element 20) are integrally formed so as to dispense with the bonding layer 230.

Furthermore, the heat dissipation body 200 may form an air space A between the second support legs 202 and the stop portion 23 according to needs so as to retain overflow of the permanent fluid 21a.

In addition, the bonding material 22 is an adhesive material or a metal adhesive material different from the material of the permanent fluid 21a. The permanent fluid 21a is liquid metal or oil, which remains fluid after the final fabrication process. That is, in the final product, the permanent fluid 21a is not cured. For example, the permanent fluid 21a is formed by dispensing or coating in the receiving space S of the first section A1 of the heat dissipation body 200.

Figure 2B:
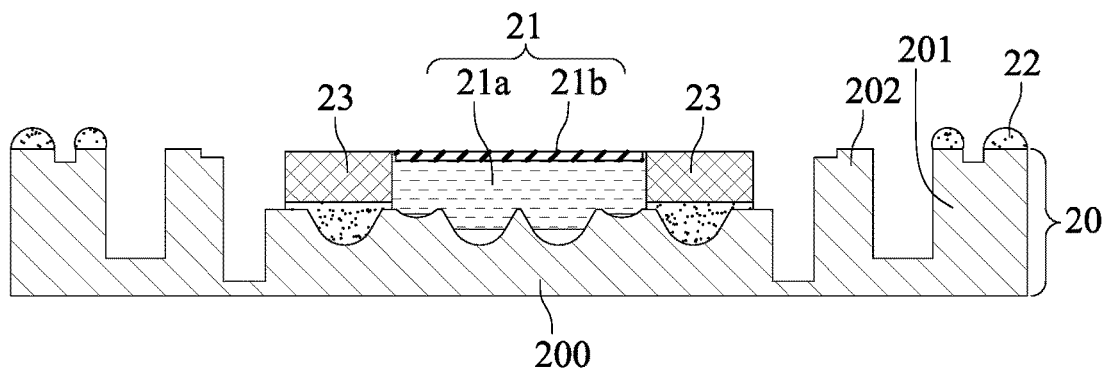

As shown in FIG. 2B, the permanent fluid 21a is leveled in the receiving space S of the heat dissipation body 200 and then a flow guide portion 21b is correspondingly disposed on the permanent fluid 21a. As such, the flow guide portion 21b and the permanent fluid 21a serve as an intermediary structure 21 on the heat dissipation element 20.

In an embodiment, the flow guide portion 21b is a plate, such as a metal plate made of copper, which is located in the receiving space S of the heat dissipation body 200 without extending beyond the stop portion 23.

Further, the flow guide portion 21b is a mesh-shaped plate, which has a plurality of meshes with different specifications (e.g., rectangular openings of FIG. 2B') or has a plurality of meshes 210 with the same specification (e.g., circular openings of FIG. 2B"). As shown in rectangular meshes of FIG. 2B', the plate has a plurality of first meshes 211 and a plurality of second meshes 212, the width D1 of the first meshes 211 is greater than the width D2 of the second meshes 212. For example, the width D1 of the first meshes 211 is 20 to 500 um, and the width D2 of the second meshes 212 is less than 20 um (even 0 um, i.e., no opening).

Figure 2C:
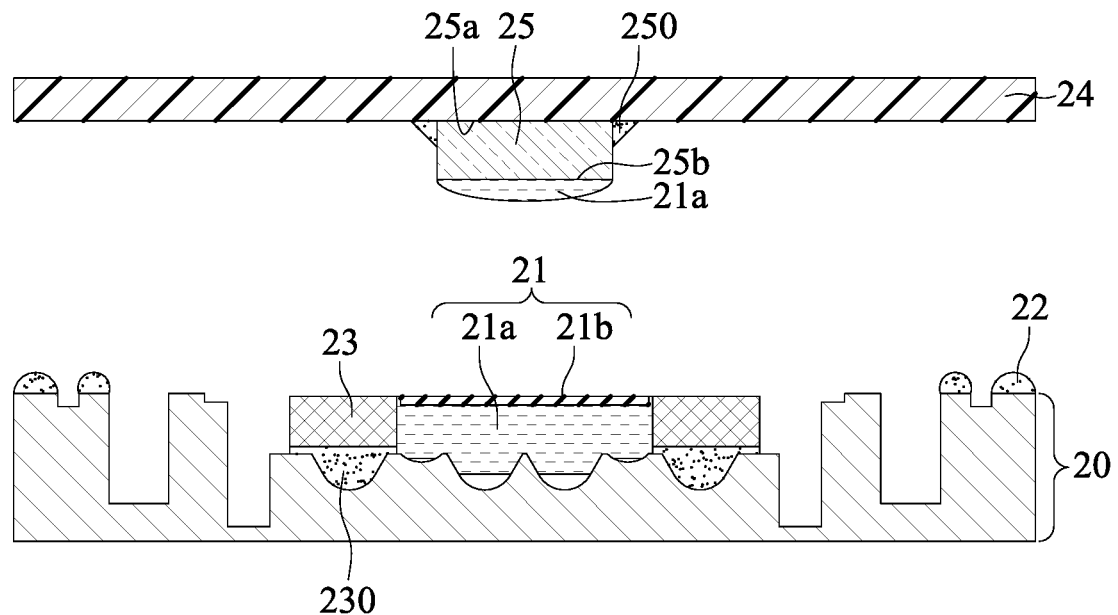

As shown in FIG. 2C, a carrier 24 having at least one electronic element 25 disposed thereon is provided.

In an embodiment, the carrier 24 is a packaging substrate having a core layer and a circuit structure or a coreless circuit structure, which has a circuit layer such as a fan-out redistribution layer (RDL) formed on a dielectric material. Also, the carrier 24 can be other carrier structure for carrying an electronic element such as a semiconductor chip. For example, the carrier 24 can be a lead frame or a silicon interposer. But it should be noted that the carrier 24 is not limited to the above-described examples.

The electronic element 25 can be an active element such as a semiconductor chip, a passive element such as a resistor, a capacitor or an inductor, or a combination thereof. For example, the electronic element 25 is electrically connected to the circuit layer of the carrier 24 in a flip-chip manner or wire-bonding manner. The electronic element 25 has a first surface 25a and a second surface 25b opposite to the first surface 25a. The first surface 25a of the electronic element 25 is mounted to the carrier 24 through an adhesive layer 250 (e.g., an underfill). However, the manner in which the electronic element 25 connects the carrier 24 is not limited to the above-described examples.

Further, the permanent fluid 21a can be coated on the second surface 25b of the electronic element 25 according to needs.

Figure 2D:
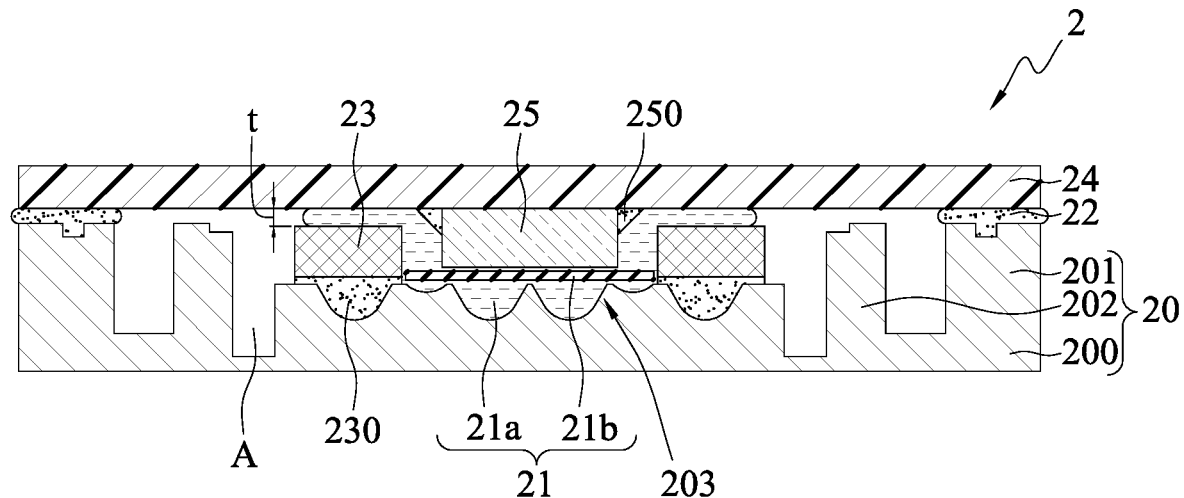
Figure 2D:
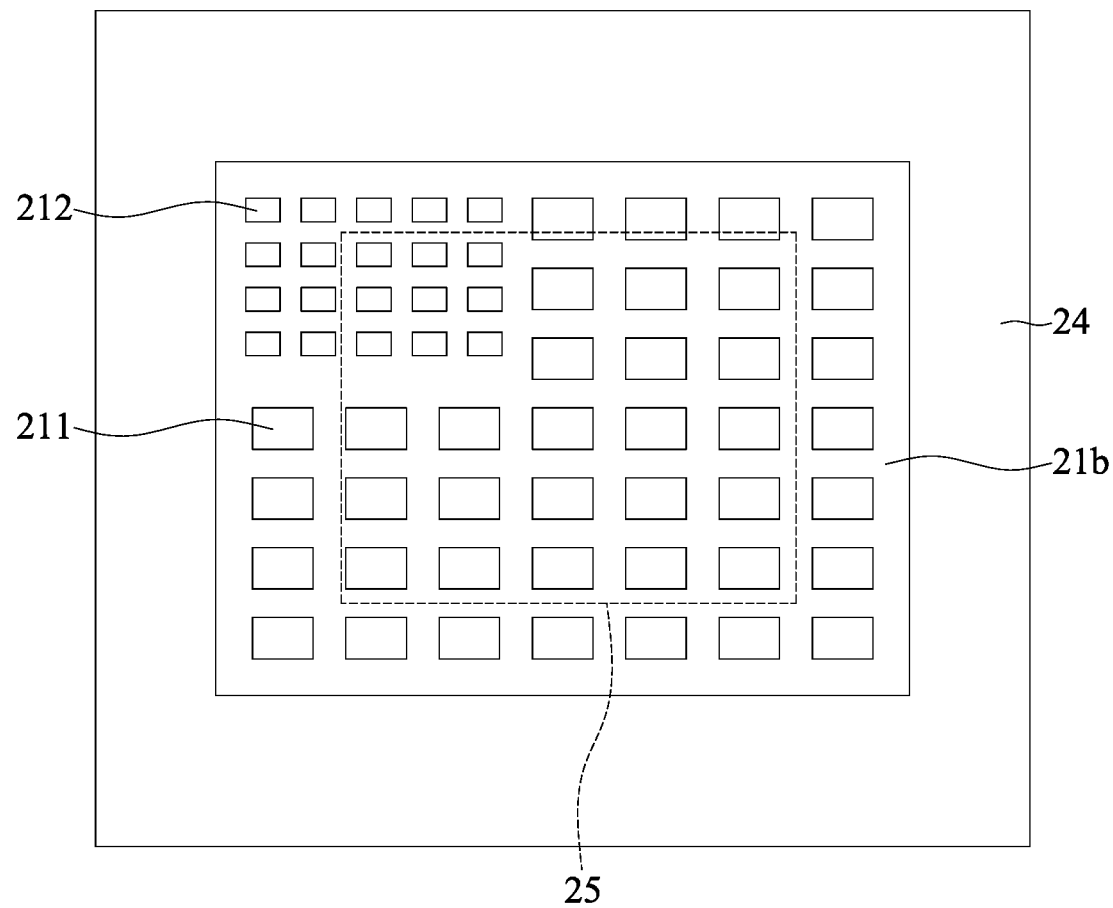

As shown in FIG. 2D, in a vacuum state, the second surface 25b of the electronic element 25 is laminated on the intermediary structure 21 toward the heat dissipation element 20 so as to bond the heat dissipation body 200 of the heat dissipation element 20 to the second surface 25b of the electronic element 25 through the permanent fluid 21a. As such, the intermediary structure 21 serves as a thermal interface material (TIM). Further, the first support legs 201 of the heat dissipation element 20 are bonded onto the carrier 24 through the bonding material 22.

In an embodiment, the meshes 210 (or the second meshes 212) of the flow guide portion 21b are arranged corresponding to a hot spot region of the electronic element 25. For example, the flow guide portion 21b has more second meshes 212 arranged corresponding to the hot spot region of the electronic element 25 (that is, small meshes are arranged with high density to increase the metal distribution area of the hot spot region) and more first meshes 211 arranged corresponding to the non-hot spot region of the electronic element 25. As shown in FIG. 2D', one corner of the electronic element 25 (upper left corner) is a hot spot region and the second meshes 212 are arranged in this corner with high density so as to increase the heat dissipation efficiency of the hot spot region of the electronic element 25.

Further, at least a gap t (referring to FIG. 2D) is formed between the stop portion 23 and the carrier 24, and is at least greater than 0.3 mm so as to reduce the risk of damage of the carrier 24 (such as cracking) due to thermal expansion and contraction of the stop portion 23 and further prevent the permanent fluid 21a from flowing out of cracks of the carrier 24. Alternatively, as shown in electronic package 3 of FIG. 3, a strengthening layer 33 can be arranged between the stop portion 23 and the carrier 24 according to needs. The strengthening layer 33 is a porous elastic bonding material, which prevents outflow of the permanent fluid 21a and absorbs stresses to prevent deformation of the carrier 24. Similarly, a gap t' (as shown in FIG. 3) or a strengthening layer 33' (a porous elastic bonding material, as shown in FIG. 3') is formed between the second support legs 202 and the carrier 24 so as to prevent problems such as outflow of the permanent fluid 21a and damage of the carrier 24.

Figure 3:
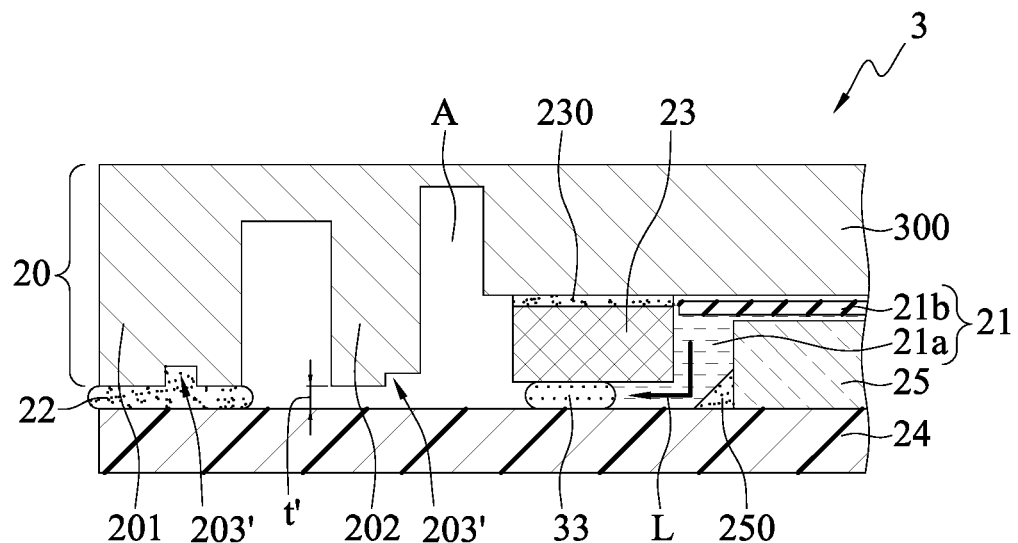
FIG. 3 is a partial schematic cross-sectional view of an electronic package according to another embodiment of the present disclosure.
Figure 3:
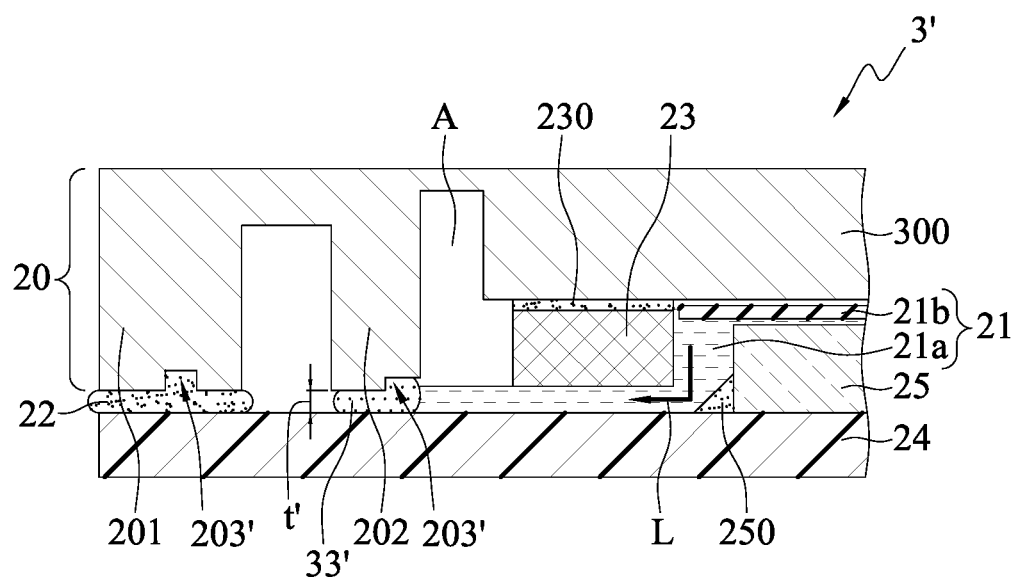

Furthermore, as shown in FIG. 3, the surface of the first section A1 of the heat dissipation body 300 can be flat without the concave-convex structure 203, and the first support legs 201 (or the second support legs 202) can have at least one concave-convex structure 203' formed according to needs. The concave-convex structure 203' can be filled with an adhesive material (e.g., the bonding material 22) so as to prevent outflow of the permanent fluid 21a.

Figure 4:
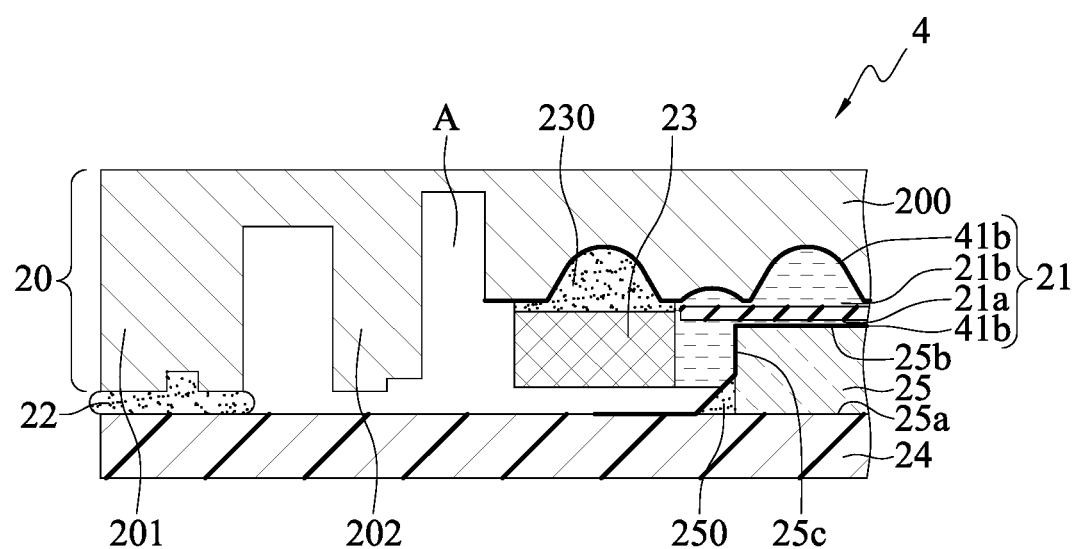
FIG. 4 is a partial schematic cross-sectional view of an electronic package according to a further embodiment of the present disclosure.

Further, referring to an electronic package 4 of FIG. 4, the intermediary structure 21 further comprises an auxiliary portion 41b such as a metal layer (e.g., Ti, Cu, Au, Ag, In, Ga, Sn, and so on) or a polymer layer, which bonds with the electronic element 25 and/or the heat dissipation element 20. For example, the auxiliary portion 41b is formed on the electronic element 25 so as to obtain a preferred bonding between the permanent fluid 21a and the electronic element 25. A metal layer such as a Ti layer is served as the auxiliary portion 41b to cover the second surface 25b and side surface 25c of the electronic element 25, the adhesive layer 250 and a portion of the surface of the carrier 24, and even cover on the heat dissipation body 200. As such, when the electronic element 25 is laminated to the heat dissipation element 20, the permanent fluid 21a can be bonded onto the auxiliary portion 41b.

Therefore, since the permanent fluid 21a and the flow guide portion 21b are made of flexible materials, the present disclosure can effectively disperse thermal stresses. Further, the flow guide portion 21b has extremely high thermal conductivity and specific heat capacity so as to improve the overall heat transfer efficiency of the thermal interface material. Furthermore, due to a high surface tension of the permanent fluid 21a, the flow guide portion 21b can restrain the flow of the permanent fluid 21a on the surface of the electronic element 25 (e.g., the second surface 25b and the side surface 25c of the electronic element 25), thereby attaching the permanent fluid 21a onto the electronic element 25. Compared with the prior art, the intermediary structure 21 of the electronic package 2 of the present disclosure not only achieves a better heat dissipation effect, but also can prevent excessive warping of the electronic element 25 or the heat dissipation element 20 due to stress concentration.

Further, the arrangement of the stop portion 23 facilitates to lengthen the flow path of the permanent fluid 21a (e.g., the curved path L of FIG. 3). Consequently, it is not easy for the permanent fluid 21a to flow out of the heat dissipation element 20.

Furthermore, when the temperature rises, the volume of the permanent fluid 21a expands and thus the permanent fluid 21a flows into the air space A, thereby preventing the permanent fluid 21a from pressing against the electronic element 25 or the heat dissipation element 20 and adversely affecting the operation thereof.

In addition, the concave-convex structures 203' of the first support legs 201 strengthen the bonding of the bonding material 22. As such, even if air bubbles are generated during heating of the bonding material 22 and thus weakens the structural strength of the bonding material 22, the engagement between the concave-convex structures 203' and the bonding material 22 can prevent delamination of the heat dissipation element 20.

The present disclosure further provides an electronic package 2, 3, 3', 4, which includes an electronic element 25, an intermediary structure 21 and a heat dissipation element 20.

The intermediary structure 21 is disposed on the electronic element 25, wherein the intermediary structure 21 comprises a flow guide portion 21b and a permanent fluid 21a combined with the flow guide portion 21b, and the permanent fluid 21a is attached onto the electronic element 25.

The heat dissipation element 20 is bonded to the electronic element 25 through the intermediary structure 21.

In an embodiment, the permanent fluid 21a is liquid metal or oil.

In an embodiment, the flow guide portion 21b is a plate, such as a metal plate. For example, the plate has a plurality of meshes with different specifications. The plate has a plurality of first meshes 211 and a plurality of second meshes 212, and the width D1 of the first meshes 211 is greater than the width D2 of the second meshes 212 (the width of the second meshes 212 can be zero).

In an embodiment, the heat dissipation element 20 comprises a heat dissipation body 200, 300 and a plurality of first support legs 201 and second support legs 202 disposed on the heat dissipation body 200, 300. The heat dissipation body 200, 300 is bonded to the electronic element 25 through the intermediary structure 21. For example, the heat dissipation body 200 has a concave-convex structure 203. Alternatively, the first support legs 201 or the second support legs 202 have concave-convex structures 203'.

In an embodiment, the heat dissipation element 20 has a concave-convex structure 203, 203'.

In an embodiment, the heat dissipation element 20 has at least one air space A for retaining overflow of the permanent fluid 21a.

In an embodiment, the electronic package 2, 3, 3', 4 further includes at least one stop portion 23, 23' disposed on the heat dissipation element 20 for stopping overflow of the permanent fluid 21a. The stop portion 23 is disposed on the heat dissipation element 20. For example, the stop portion 23 is bonded onto the heat dissipation element 20 through a bonding layer 230. Alternatively, the stop portion 23' and the heat dissipation element 20 are integrally formed.

In an embodiment, the electronic package 2, 3, 3', 4 further includes a carrier 24 for carrying the electronic element 25, wherein the carrier 24 is electrically connected to the electronic element 25. Further, a stop portion 23, 23' can be disposed on the heat dissipation element 20, and a gap t or a strengthening layer 33 is formed between the stop portion 23, 23' and the carrier 24. Alternatively, a gap t' (referring to the electronic package 3 of FIG. 3) or a strengthening layer 33' (referring to the electronic package 3' of FIG. 3') is formed between the heat dissipation element 20 and the carrier 24.

In an embodiment, the intermediary structure 21 further comprises an auxiliary portion 41b such as a metal layer or a polymer layer bonded to the electronic element 25 and/or the heat dissipation element 20 so as to come into contact with the permanent fluid 21a.

Therefore, through the design of the permanent fluid and the flow guide portion, the intermediary structure of the electronic package of the present disclosure not only achieves a better heat dissipation effect, but also can prevent the problem of stress concentration.

Further, through the design of the stop portion, it is not easy for the permanent fluid to flow out of the heat dissipation element.

Furthermore, the air space facilitates to prevent the permanent fluid from adversely affecting the operation of the electronic element or the heat dissipation element.

In addition, the concave-convex structures of the support legs strengthen the bonding so as to prevent delamination of the heat dissipation element.

The above-described descriptions of the detailed embodiments are to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
an electronic element;
an intermediary structure disposed on the electronic element, wherein the intermediary structure comprises a flow guide portion and a permanent fluid combined with the flow guide portion, wherein the flow guide portion is a plate having a plurality of meshes with different specifications, and wherein the permanent fluid is attached onto the electronic element; and
a heat dissipation element bonded to the electronic element through the intermediary structure.

2. The electronic package of claim 1, wherein the permanent fluid is liquid metal or oil.

3. The electronic package of claim 1, wherein the plate is a metal plate.

4. The electronic package of claim 1, wherein the plate has a plurality of first meshes and a plurality of second meshes, and wherein the first meshes are greater in width than the second meshes.

5. The electronic package of claim 1, wherein the heat dissipation element comprises a heat dissipation body and support legs disposed on the heat dissipation body, and wherein the heat dissipation body is bonded to the electronic element through the intermediary structure.

6. The electronic package of claim 5, wherein the heat dissipation body has a concave-convex structure.

7. The electronic package of claim 5, wherein the support legs have concave-convex structures.

8. The electronic package of claim 1, wherein the heat dissipation element has a concave-convex structure.

9. The electronic package of claim 1, wherein the heat dissipation element has an air space for retaining overflow of the permanent fluid.

10. The electronic package of claim 1, further comprising a stop portion disposed on the heat dissipation element for stopping overflow of the permanent fluid.

11. The electronic package of claim 10, wherein the stop portion is bonded onto the heat dissipation element through a bonding layer.

12. The electronic package of claim 10, wherein the stop portion and the heat dissipation element are integrally formed.

13. The electronic package of claim 1, further comprising a carrier for carrying the electronic element, wherein the carrier is electrically connected to the electronic element.

14. The electronic package of claim 13, further comprising a stop portion disposed on the heat dissipation element, and a gap or a strengthening layer formed between the stop portion and the carrier.

15. The electronic package of claim 13, further comprising a gap or a strengthening layer formed between the heat dissipation element and the carrier.

16. The electronic package of claim 1, wherein the intermediary structure further comprises an auxiliary portion bonded to the electronic element and/or the heat dissipation element to come into contact with the permanent fluid.

\* \* \* \* \*